United States Patent [19]

Evans, Jr.

[11] 4,084,985

[45] Apr. 18, 1978

[54] METHOD FOR PRODUCING SOLAR ENERGY PANELS BY AUTOMATION

[75] Inventor: John C. Evans, Jr., North Olmsted, Ohio

[73] Assignee: The United States of America as represented by the Administrator of the National Aeronautics and Space Administration, Washington, D.C.

[21] Appl. No.: 790,637

[22] Filed: Apr. 25, 1977

[51] Int. Cl.² .................. H01L 31/04; H01L 31/18
[52] U.S. Cl. .................. 136/89 P; 29/572; 136/89 H; 136/89 CC; 156/633
[58] Field of Search .......... 136/89 P, 89 PC, 89 H, 136/206, 89 CC; 29/572; 156/633

[56] References Cited

U.S. PATENT DOCUMENTS

| 2,428,537 | 10/1947 | Veszi et al. | 136/89 |
| 3,553,030 | 1/1971 | Lebrun | 136/89 |
| 3,562,020 | 2/1971 | Blevins | 136/89 |
| 3,565,719 | 2/1971 | Webb | 156/212 |
| 3,658,596 | 4/1972 | Osborne | 136/89 |
| 3,780,424 | 12/1973 | Forestieri | 29/572 |
| 3,849,880 | 11/1974 | Haynos | 29/626 |
| 4,019,924 | 4/1977 | Kurth | 136/89 P |

Primary Examiner—Aaron Weisstuch
Attorney, Agent, or Firm—N. T. Musial; J. R. Manning; G. E. Shook

[57] ABSTRACT

A solar cell panel is fabricated by photoetching a pattern of collector grid systems with appropriate interconnections and bus bar tabs into a glass or plastic sheet. These regions are then filled with a first, thin conductive metal film followed by a layer of a mixed metal oxide, such as $InAsO_x$ or $InSnO_x$. The multiplicity of solar cells are bonded between the protective sheet at the sites of the collector grid systems and a back electrode substrate by conductive metal filled epoxy to complete the fabrication of an integrated solar panel.

21 Claims, 5 Drawing Figures

METHOD FOR PRODUCING SOLAR ENERGY PANELS BY AUTOMATION

ORIGIN OF THE INVENTION

The invention described herein was made by an employee of the U.S. Government and may be manufactured or used by or for the Government without the payment of any royalties thereon or therefor.

BACKGROUND OF THE INVENTION

1. Field of the Invention

The present invention relates to a simplified and more integrated approach for fabricating solar energy panels for the large scale generation of electric power by a fully automated procedure. More particularly, the present invention relates to an automated method of fabricating solar panels whose conversion efficiency is at least as great as any panels now assembled by hand.

2. Description of the Prior Art

Solar panels have been prepared in the past by a variety of techniques and are generally characterized by containing a multiplicity of solar cells supported on a suitable support material. Each cell is provided with electrodes for the transport of current generated by incident photons, and is conductively interconnected with the other cells of the panel so that all of the current generated by the individual cells is collected and available to perform work. U.S. Pat. No. 3,780,424 shows a silicon cell solar array in which a series of solar cells are provided with grid systems which in turn are connected to bus bars for the collection and distribution of electric current. The solar panels are formed by supporting the cells on a polyimide substrate via a layer of adhesive material such as fluorinated ethylene-propylene copolymer. A protective cover layer of fluorinated ethylene propylene copolymer is also provided. U.S. Pat. No. 3,658,596 shows a solar cell modular assembly in which silicon photovoltaic cells are fused between two sheets of fluorinated ethylene propylene copolymer wherein the solar cells are provided with negative grids and collectors. U.S. Pat. No. 3,849,880 discloses a method of fabricating a solar cell array in which individual solar cells are positioned on preprinted areas of a substrate by an adhesive. A region of the bottom of each cell is not coated with adhesive in order to leave portions thereof available for the attachment of interconnectors. The complicated procedure further requires that the substrate must be prepunched so that apertures are available at positions of contact of an interconnector and the bottom of each cell. Electrical interconnectors must then be slid into position such that they touch the top electrode of at least one cell and the base electrode of an adjacent cell. The interconnectors are then welded directly to the top electrodes and through the prepunched apertures in the substrate to the base electrodes. These prior art techniques have the common disadvantage that they are too costly and complicated to permit the facile commercial production of solar panels for use in industrial, commercial and residential power applications. Moreover, none of the prior art techniques of fabricating solar panels are fully automated, which is a factor which increases the cost of production of solar units.

The individual solar cells which are commonly formed are heterojunction and Schottky barrier devices. Examples of heterojunction devices include $Ga_{1-x}Al_xAs$-GaAs, ZnSe-GaAs, GaP-Si and ZiS-Si devices. Solar cells of the $Ga_{1-x}Al_xAS$-nGaAs type are commonly fabricated by liquid phase epitaxy, while nZnSe-pGaAs devices have been fabricated by both liquid phase epitaxy and vapor growth. While the LPE formed ZnSe-GaAs device exhibits low conversion efficiency, the device exhibits good spectral response characteristics at high photon energies which verifies the theory that the recombination velocity should be low at the heterojunction. Epitaxial ZnS-Si and GaP-Si heterojunction devices can be fabricated by a number of methods. However, in the preparation of these devices the Si substrate must be cleaned of surface oxide. Moreover, at the temperature of fabrication of the GaP-Si devices, a major problem encountered is the cracking of the GaP layers created by the stress caused by the thermal expansion difference between GaP and Si.

Schottky barrier devices are the simplest types of solar cells to prepare in that they only require an ohmic contact on the back of the devices and a transparent metal at the front. The transparent metal film is usually deposited by evaporation and is usually of an expensive noble metal such as platinum, gold, silver or the like. Another type of heterojunction or Schottky device which is receiving attention is a device which has a transparent conductive glass of a material such as $In_2O_3$, $SnO_x$, ZnO or the like. The oxide layer is highly transparent, usually above 90% for layers several thousand angstroms thick. Several devices on this order have been made using $SnO_2$ on Si and GaAs substrates but their efficiencies have been low, probably caused by the poor quality of the $SnO_2$ films. However, Anderson, *Glass-Si Heterojunction Solar Cells*, NSF RANN Report: HER 74-17631, July, 1975 has reported $In_2O_3$ and $SnO_2$ coated silicon semiconductor devices wherein the $SnO_2$ coated device achieved an efficiency of 10%. $SnO_2$ coated devices are commonly prepared by evaporating or sputtering Sn onto a substrate and then oxidizing with oxygen. Alternatively, an $SnCl_4$ film can be oxidized. Dubow et al. (Colorado State University) have reported $In_2O_3$ silicon solar devices which have conversion efficiencies of 3.3%.

The difficulty with the prior art solar cell devices is that the solar panel arrays are formed by fabricating and placing individual cells within a panel and then coupling all of the cells into conductive relationship by soldering or welding all interconnection wires or metal strips followed by some form of protective covering. Thus, the prior art procedures are multi-step techniques, and because of the relative complexity of the preparative procedures, the resulting panels are relatively expensive. A need, therefore, continues to exit for a fully automated method of producing solar cell panels which would be industrially advantageous, thereby leading to decreased costs of production.

SUMMARY OF THE INVENTION

Accordingly, one object of the present invention is to provide a method which permits the fully automated assembly of solar panel devices.

Another object of the present invention is to provide a cheaper method of fabricating solar cell devices than is provided by non-automated techniques of assembling solar cell panels.

Briefly, these objects and other objects of the present invention as hereinafter will become more readily apparent can be attained in a method of fabricating an integral solar cell panel containing a multiplicity of solar cells by forming an etched pattern of a multiplicity of solar cell collector grid systems with accompanying interconnection and bus bar tabs into a transparent, environmentally stable protective sheet; depositing a layer of conductive metal into the etched regions of the protective sheet followed by a layer of a conductive mixed metal oxide; forming a pattern of conductive areas with accompanying interconnection and bus bar tabs corresponding to the collector grid systems and interconnection and bus bar tabs of said protective sheet on a substrate as a backelectrode for said solar cell panel; bonding a multiplicity of solar cells between said protective sheet and said backelectrode substrate such that the position of said cells in the fabricated panel corresponds to the positions of said collector grid systems on said protective sheet and the conductive areas on said backelectrodes substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
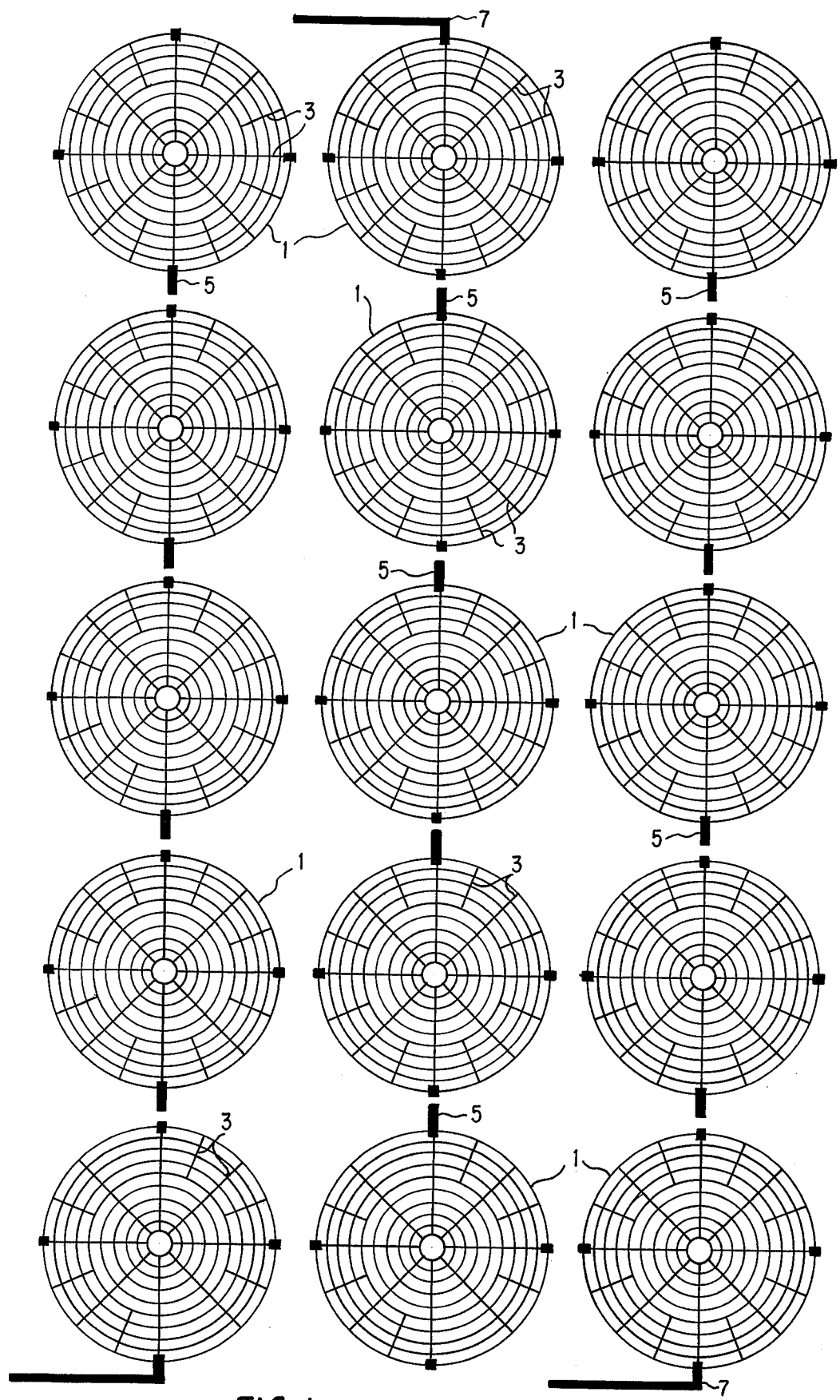
FIG. 1 shows a typical pattern of a mask employed in the photoetching of a glass or plastic sheet used as the protective covering for a panel of solar cells.

In the fabrication of a single solar panel by the method of the present invention, wherein a series of panels are grouped together to form an array of panels, a glass or clear, protective plastic sheet is cleaned by any one of a number of conventional processes after being cut to a size suitable for a solar panel. The methods by which the plastic or glass sheet is cleaned are well known with the objective to completely remove grit and grease from the surface. Usually, a series of wash steps are employed with semiconductor grade solvents and the washing is sometimes conducted in ultrasonic tanks. Suitable solvents employed in the washing steps include acetone and methanol. The sheets are usually washed with deionized water, and in some instances discharge, ion bombardment or thermal desorption can be employed to remove residual water from the sheets and residual gas molecules prior to the vacuum deposition processing. The type of plastic material employed as a sheet is not critical with the only requirements being that it must be transparent to light and stable to environmental conditions; i.e., it should possess good weatherability. Suitable plastic materials include the polymethacrylic esters, polyacrylic ester and the like. The cleaning of the glass or plastic sheet is conducted so that the surface of the sheet will receive a layer or coating of a photosensitive of a photoresist.

The photoresist generally is applied to a thickness of 25 $\mu$m to 250 $\mu$m (0.001 in. to 0.01 in.). The precise thickness of the photoresist layer applied will depend upon the collector grid line width selected for any given solar cell design. The important factor which determines the dimensions of the collector grid system is to provide an adequate low resistance collector which is able to conduct the current generated by the solar cell and the array without Joule heating and thus loss of energy. The collector grid system should only occupy on the order of several percent of the total surface area of each solar wafer so that as much as possible of the area of each solar cell wafer is available for photelectron generation. The choice of photoresist is not a critical factor and any well known photoresist can be used. The photoresist is usually applied to a substrate by automated systems by liquid spraying, roll coating, screen printing or the like. A representative method of applying a photoresist coating involves baking a substrate for about 1 hour at about 200° C under an inert gas atmosphere such as nitrogen. After the substrate is permitted to cool under an inert atmosphere, the resist is applied and then prebaked under an inert atmosphere at about 80° C for about 30 minutes under an infrared lamp. The film it then exposed to light through a mask having the desired pattern to be formed in the photoresist for about one second to a 200 watt high pressure collimated laboratory UV lamp. The exposed resist is then developed by removing unhardened photoresist with a conventional developer such as KTFR developer for about 40 seconds and then is sprayed with the developer. Common solvents for unhardened photoresists include petroleum distillates, trichloroethylene and n-butylacetate. The resist is then postbaked for about 1 hour at about 150° C under an inert atmosphere. After inspection of the developed image for quality of reproduction, the substrate is then etched or receives a coating as desired, for example, a sputtered metal oxide film may be applied. The residual polymerized photoresist film is then dissolved from the substrate using a conventional solvent which removes hardened resist such as xylene. A suitable etchant which is also useful for etching silicon is a 7:1 NH$_4$F:HF mixture which is used at 30° C for 6.25 minutes for each micron depth of etching desired.

A mask is prepared which defines a pattern of a series of solar cells collector grid systems with accompanying interconnection tabs and bus bar tabs, and is placed over the photoresist coating on the glass or plastic sheet. A typical pattern is shown in FIG. 1 which describes a series of areas 1 each having a collector grid system 3. Portions 5 correspond to tabs which provide for the eventual electrical interconnection of all solar cell wafers in a row. One solar cell area at one of the ends of each solar cell row is provided with a portion 7 which corresponds to bus bar connection tabs of the completed panel. The photoresist coating material can be a standard positive or negative type of resist in which the portions of the resist exposed to light are either hardened or resist polymerization. The masked sheet is then exposed to activating radiation such as ultraviolet light from a suitable source for a time sufficient to form the desired image.

The mask is removed and the unhardened portions of the photoresist layer are removed by washing the layer with any well known conventional solvent for the removal of unhardened photoresist such as n-butylacetate, petroleum distillates, trichloroethylene and the like. Such commercial developers include Kodak KTFR, Dupont's "Riston" and the like; thus etching the image of the mask into the resist layer. The sheet is then cleaned.

Figure 2:
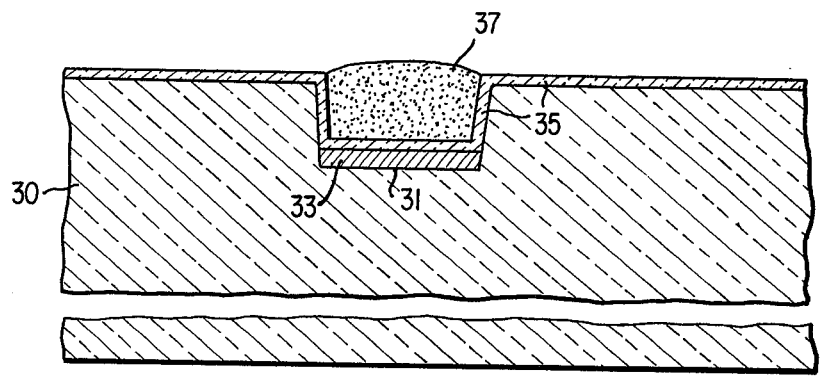
FIG. 2 is a cross-section of a portion of the etched protective glass or plastic sheet of a solar panel showing the profile of the structure of a collector arm of a collector grid system.

After cleaning, the patterned sheet is exposed to an etchant which etches the collector grid pattern, interconnection tabs and bus bar tabs into the glass or plastic sheet. Glass sheets are commonly etched through the patterned photoresist film with hydrofluoric acid solutions, while if a plastic substrate such as an acrylic material is used, it can be similarly etched with an organic carboxylic acid such as acetic acid solutions. The concentration of acid in any of the etchant solutions is not critical and can be any concentration desired. FIG. 2 shows a small cross-section of the glass or plastic sheet 30 containing an etched groove 31 in which is deposited the various layers for the fabrication of a conductive lead of the collector system of a given solar cell. In the etching process, no matter what type of sheet 30 is used, the grooves 31 which are etched into the sheet 30 are on the order of at least one millimeter in depth, although this depth is not absolutely critical. A thin layer of conductive metal 33 is then deposited by cathodic sputtering, RF sputtering or a vacuum evaporation technique into the groove 31 to a depth which is about one quarter of the total depth of the groove. In other words, the depth of the conductive metal layer 33 is about 250 $\mu$m in thickness. The conductive metal deposited in the etched grooves should be compatible with an n-type layer on the top surface of the solar cell adjacent the glass or plastic sheet 30. Suitable conductive metals for layer 33 include silver, titanium, copper, tin and gold, although the cheaper metals of copper and aluminum are preferred. After deposition of the conductive metal, the photoresist layer is completely removed from the sheet by washing the sheet with an appropriate solvent. The same types of conventional solvents described above for removing hardened photoresist materials are used in this step to remove the photoresist. The etched sheet is cleaned of any remaining resist as well as extraneous metal with conventional solvents.

Continuing to refer to FIG. 2, the cleaned sheet is ready for the application of a conductive film of a mixed metal oxide material 35. It should be explained at this point that while the depth of the initially etched groove 31 ranges up to about 1 millimeter, the width can vary as desired and is not critical. A mask containing a series of holes each of a size sufficient to accomodate a solar cell is placed over the etched and conductive metal filled sheet such that the surface areas on the sheet corresponding to each solar cell is exposed through a hole in the mask. The mask may be fabricated from metal or plastic, and the holes in the mask are of the conventional size for solar cell discs. A thin layer 35 of mixed metal oxide is then applied through the holes of the masks onto the substrate which covers all of the surface area of the solar cells, as well as the interconnection and bus bar tabs. The mixed metal oxide layer 35 formed over the cells and in the grooves is about 10 $\mu$m in depth. This means that as far as the grooves are concerned, about one-quarter of the original depth of the grooves is filled with conductive metal layer 33 and mixed metal oxide layer 35. The remaining approximately three-quarters of the depth of the grooves is then subsequently filled with conductive epoxy 37 to complete filling of the grooves and to aid in the bonding of the solar cell wafers to the sheet 30. In one method of the deposition step, the mixed metal oxide film 35 having the desired conductivity characteristics is deposited by RF sputtering of the mixed metal oxides without further oxidation or processing. Suitable mixed metal oxides include an indium-tin oxide or indium-arsenic oxide, or even $SnO_2$ itself. In another method of deposition, the metal oxide film 35 which coats the conductive metal is formed by the application or deposition of metal film such as by vacuum evaporation, followed by oxidation of the metal film 35 or by the deposition of tin chloride with subsequent oxidation of the tin chloride to tin oxide. Suitable metals which can be deposited on the conductive metal layer include indium-tin, indium-arsenic, tin and the like. The deposited metal is then oxidized by an oxygen containing gas such as air, inert gas-oxygen mixtures, moist air and the like, at a temperature sufficient to promote oxidation, such as about 300°–400° C. The same oxidizing atmosphere can be used to oxidize the deposited tin chloride. In actuality, many techniques can be used to deposit and apply the metal oxide layer to the conductive metal layer since the technique used is not critical.

The type of substrate 30 used, i.e., whether glass or plastic, also is a factor in determining the method employed for the formation of the metal oxide film on the conductive metal film 33 of the collector system. Therefore, codeposition of metals to form a metal film which is subsequently subjected to oxidation and cathodic (DC) sputtering of a metal film followed by oxidation at high temperature can be conveniently used for glass substrates. Glass can tolerate the deposition of a metal or mixture of metals and the subsequent heating to high temperature to form the metal oxide film. On the other hand, plastic substrates may not be able to withstand the high oxidation temperatures employed. Consequently, RF sputtering of the metal oxide may be a technique of choice for plastic substrates. The same masking techniques may be employed regardless of the type of substrate employed.

In an alternative method of providing the sheet 30 with a conductive mixed metal oxide coating in the desired areas, the sheet is coated with a layer of photoresist in the conventional manner. A mask provided with holes which correspond to the grid pattern on the sheet is placed over the photoresist layer, and the masked layer is subjected to a source of activating energy such as ultraviolet radiation. The unexposed, unhardened regions of the photoresist layer are then dissolved and washed from the layer by a suitable solvent, thereby forming a pattern of opened regions over the sheet 30 which correspond to the positions of the subsequently applied silicon wafers. After development of the pattern in the photoresist layer, the mixed metal oxide layer is formed on the sheet as described above, and thereafter, the photoresist layer is removed and the sheet is cleaned.

In the techniques described above for providing the integrated solar panel with a conductive mixed metal oxide layer, the conductive metal oxide layer is formed in a manner such that it becomes an integral part of the glass or plastic sheet. An alternative to this situation would be to make the mixed metal oxide an integral part of each solar cell before they are attached to the glass or plastic sheet to complete the fabrication of the overall solar panel. In the alternative embodiment, solar cell wafers of nominal size are provided with masks which expose all portions of the surfaces of the wafers to be coated except the outer periphery of each cell. Alternatively, the wafers can be coated with a photoresist which is then exposed to light and developed such that only the outer periphery of each cell is coated with hardened photoresist. A layer of mixed metals such as indium-tin or the like as described above can then be deposited to a thickness described above by a conventional technique such as vacuum deposition on each wafer. The deposited layers can then be oxidized in the manner described above to form a conductive mixed metal oxide layer on each wafer.

After the sheet has been cleaned of extraneous mixed metal oxide in the conventional manner, the etched grooves in the sheet are completely filled with conductive metal containing epoxy, which include the interconnection tabs and bus bar tabs which correspond to pattern portions 5 and 7 of the pattern shown in FIG. 1. The metal containing conductive epoxy in the grooves not only acts as the means of bonding each individual solar cell to the glass or plastic sheet 30, but also is the principal conductive component in each groove of the collector grid system. By simply filling each groove of the collector grid system with metal containing epoxy from the surface by any convenient means such as a squeegee, sufficient epoxy is present to bond the solar cell wafers to sheet 30. The metal filled epoxy can also be applied by silk screen techniques. In earlier solar cell technology, metal filled epoxy resins were used as a means of fastening a metal screen collector to solar cell wafers. Excess expoxy in these cases was simply removed by a squeegee having the surface above the grooves free of epoxy. The metal filled epoxy resin per se is a conventional material having a volume resistivity of about $1 \times 10^{-4}$ to $1 \times 10^{-5}$ ohm-cm and contains an extremely high content of metal particles on the order of about 98%. If too much epoxy is present in the composition, insufficient contact between metal particles will result, thus lowering the conductivity of the conductive epoxy. The type of epoxy used in such a conductive epoxy composition is not critical. Suitable metal particles which are dispersed throughout the epoxy base include gold, silver, nickel, copper and titanium of a content and particle size sufficient to yield a metal filled epoxy having the above volume resistivity characteristics. In the bonding of the solar cells to the protective sheet, the device can be baked up to temperatures of about 400° C to sinter the particles of the epoxy layer so that conductive contact between the particles is increased. Alternatively, the conductive epoxy layer can be formed by photoetching methods in which the sheet is coated with a photoresist layer and then exposed to activating radiation such as ultraviolet light through a suitable mask. After removal of the imaged area of the photoresist in the conventional manner, the grooves are filled with the conductive epoxy. The conductive epoxy serves several functions one of which is to act as a parallel electrical conductor in conjunction with the transparent mixed metal oxide coating and the deposited metal pattern previously desposited in the grooves. The epoxy coating also functions to make a long lasting contact between the solar cell wafers and the previously deposited layers which form the conductive network of each solar panel prepared.

Further discussion is warranted concerning the solar cell wafers which are bonded to the conductive networks etched and fabricated in the glass or plastic sheet. It should be apparent that the size and shape of the wafer can be of any size and shape such as circular, square, rectangular, or the like. It is therefore apparent that the shape of the silicon wafer used will influence the shape of the patterns etched in the plastic or glass sheet or substrate 30 since the conductive pattern must fit integrally with the wafers used. The wafers can be prepared by any common conventional technique and therefore, the method of preparation is not critical. In one embodiment, a conventionally prepared cylindrical polycrystalline silicon ingot is cut into a series of circular wafers. The ingot can be diffused with an appropriate p-type dopant such as boron as the polycrystalline ingot is being formed. Alternatively, a non-diffused ingot can be sliced into wafers and thereafter the wafers can be diffused with dopant, cleaned and etched in the standard manner. However, the former procedures is preferred. The surface of each wafer which will become the backside of the solar cell when integrated in the panel can then be coated with aluminum by vacuum deposition for a backside contact and then sintered, or it can be coated with an aluminum particle epoxy paste. All of this is conventional technology in the preparation of solar cells.

Since a wide variety of epoxy resins can be employed as the basis for the conductive metal filled epoxy binder, the hardening times and conditions vary as a function of the epoxy, the type of hardener and accelerator used, the setting temperature, and the like. Thus, it is possible to use metal filled epoxies which will set up almost immediately at ambient temperatures to those which will not set for several hours and/or at elevated temperatures. In the attachment of the silicon wafers to the front or topside glass or plastic sheet 30 having the conductive metal grid network, a conductive epoxy can be employed which sets up rather rapidly. Late in the process when electrical connection is made on the back of the wafers, a heated platen can be employed, to assure that the plastic backing shrinks properly and that proper electrical contact is made between the conductive backside of the wafers and the conductive epoxy by bonding the metal areas on the shrinkable plastic to the projecting metal tabs on the front glass or plastic sheet as well as to the rear contact surface of the solar cell wafers.

After the application of the conductive epoxy in the grooves in the etched sheet, solar cell wafers are set into place in perfect register over each collector grid pattern on the sheet by a conventional mechanical technique. Once the conductive metal epoxy sets-up, the wafers are firmly held in place on the front side sheet. A completed panel is prepared by applying the conductive metal filled epoxy to the rear surface of each wafer and the applying a backelectrode substrate. This completes the bonding of the wafers to the interconnections.

Figure 4:
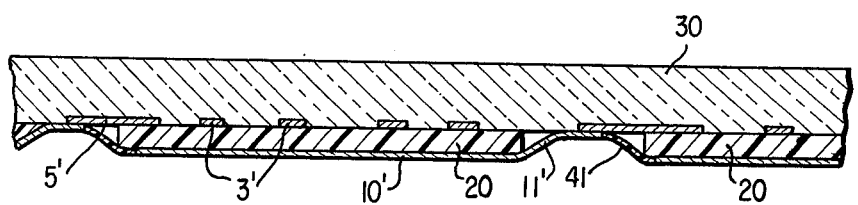
FIG. 4 is a cross-section of a portion of a completed solar cell panel showing the binding of solar cell wafers between front and back protection sheets.
Figure 3:
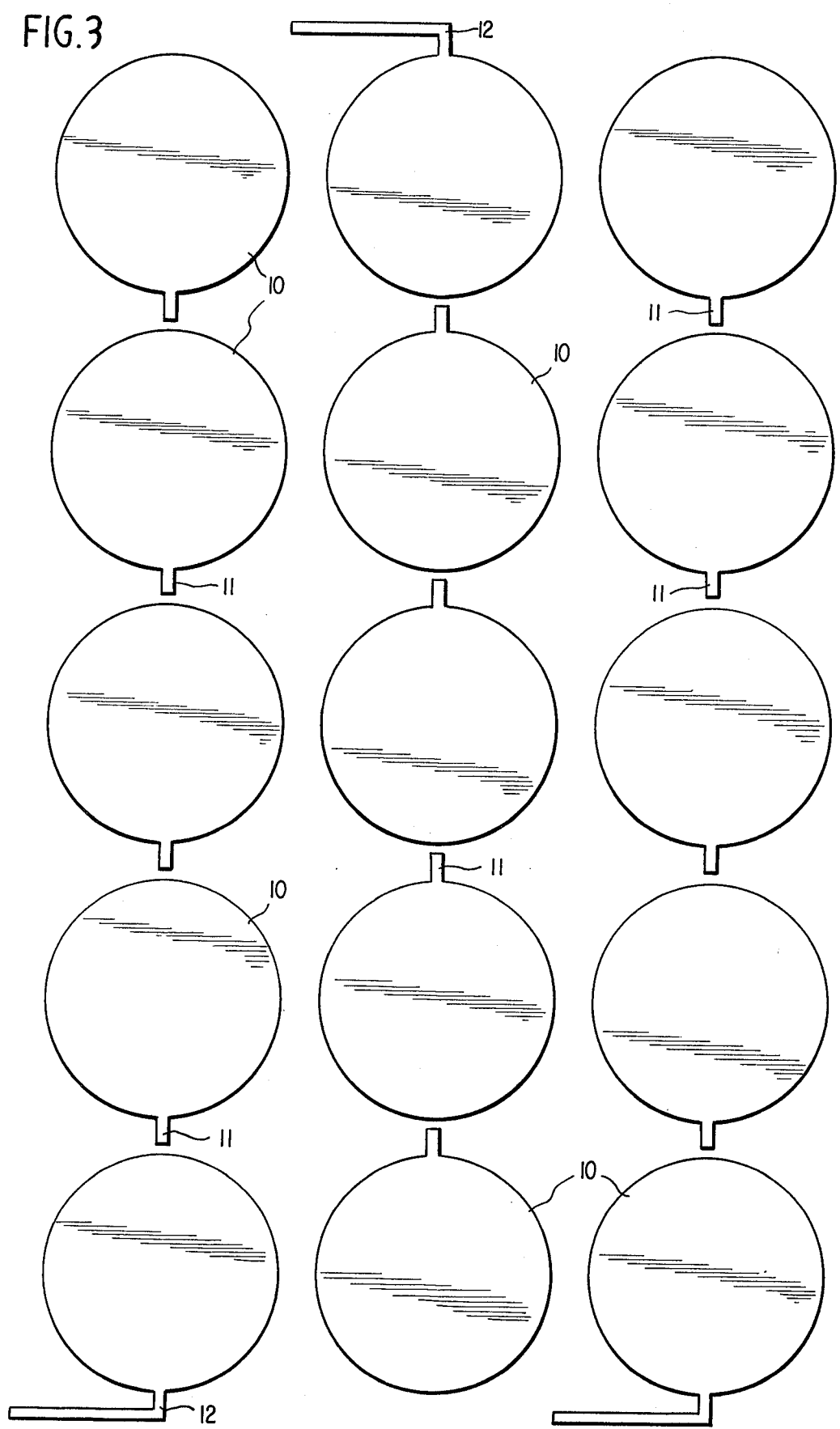
FIG. 3 shows a typical pattern of a mask employed in the photoetching of a plastic substrate used as the backelectrode substrate for a panel of solar cells.

The backelectrode substrate is prepared from a sheet of the desired size of a thermally shrinkable plastic such as polypropylene, polyethylene, polyesters, or polycarbonates. The thermally shrinkable plastic may be compounded over a wide range of melting temperatures. The characteristic feature of heat shrinkable films is that during manufacture, they are stretched in one or more directions. Biaxially oriented films stretched in two directions at right angles in the plane of the film tend to exhibit "memory" for the previously unstretched state because upon heating, they shrink to their original dimensions. An adhesive may optionally be used to aid in the bonding of the plastic backing to the front glass or plastic sheet. The types of thermally shrinkable materials described above and apparatus used in the application of these materials are well known, conventional items. The substrate of plastic material is coated with a photoresist layer and a mask is applied of a pattern which defines the shape of the wafers bonded to the protective glass or plastic covering sheet as well as interconnective channels between wafers. An example of a suitable pattern is shown in FIG. 3 wherein the open areas 10 define the areas of a plurality of solar cell wafers. Portions 11 correspond to tabs which protrude from each wafer and make eventual electrical connection with the metal tabs which protrude from the topside of the solar cell wafers corresponding to portions 5 in FIG. 1. Portions 12 correspond to bus bar connections on the rear of the solar cell wafers which make electrical contact with the bus bar connections from the top surface of the wafers corresponding to portions 7 in FIG. 1. The masked substrate is then exposed to activating radiation such as ultraviolet light and unhardened areas of the photoresist layer are removed by a conventional technique. A conductive metal which is compatible with a p-type layer on the rear surface of the solar cells such as aluminum, or silver, is deposited on the thermally shrinkable plastic sheet in the exposed areas of the photoresist in a pattern of the shape of the solar cells used along with the areas which define the interconnection tabs. The thermally shrinkable plastic sheet is then sealed to the backsides of the wafers by applying conductive metal epoxy to the metal film in the metallized regions of the plastic sheet and then aligning the plastic film on a heated platen and sealing the thermally shrinkable plastic to the wafers and front plastic or glass sheet with the application of heat, dielectric or ultrasonic bonding. Heat is applied in a vacuum environment to exclude air and entrapped moisture from the panel and to properly shrink and seal the plastic thermally shrinkable backing to the wafers and the glass or plastic protective sheet. The back plastic film is contoured over the wafers thereby making contact with the front glass or plastic sheet and then interconnections are made with the metal filled epoxy to complete electrical and mechanical assembly of the solar panel. It is also possible to coat the rear surface of each solar cell with the conductive metal to a depth sufficient to provide suitable back side conductivity, and then bond the plastic backing sheet to the wafers via conductive metal filled epoxy. FIG. 4 shows a cross-section of a portion of a completed solar cell panel showing the front glass or plastic sheet 30 containing embedded metal interconnections 5' which correspond to pattern interconnection tabs 5 as well as grid portions 3' which are formed as explained in detail earlier with reference to FIG. 2. Solar cells 20 are bonded to the front plastic or glass sheet by metal filled epoxy and thermally shrinkable rear plastic sheet 41 containing metallized areas 10' and 11' corresponding to the areas 10 and 11 of the pattern of FIG. 3 is also bonded to the solar wafers and front sheet by conductive epoxy.

Figure 5:
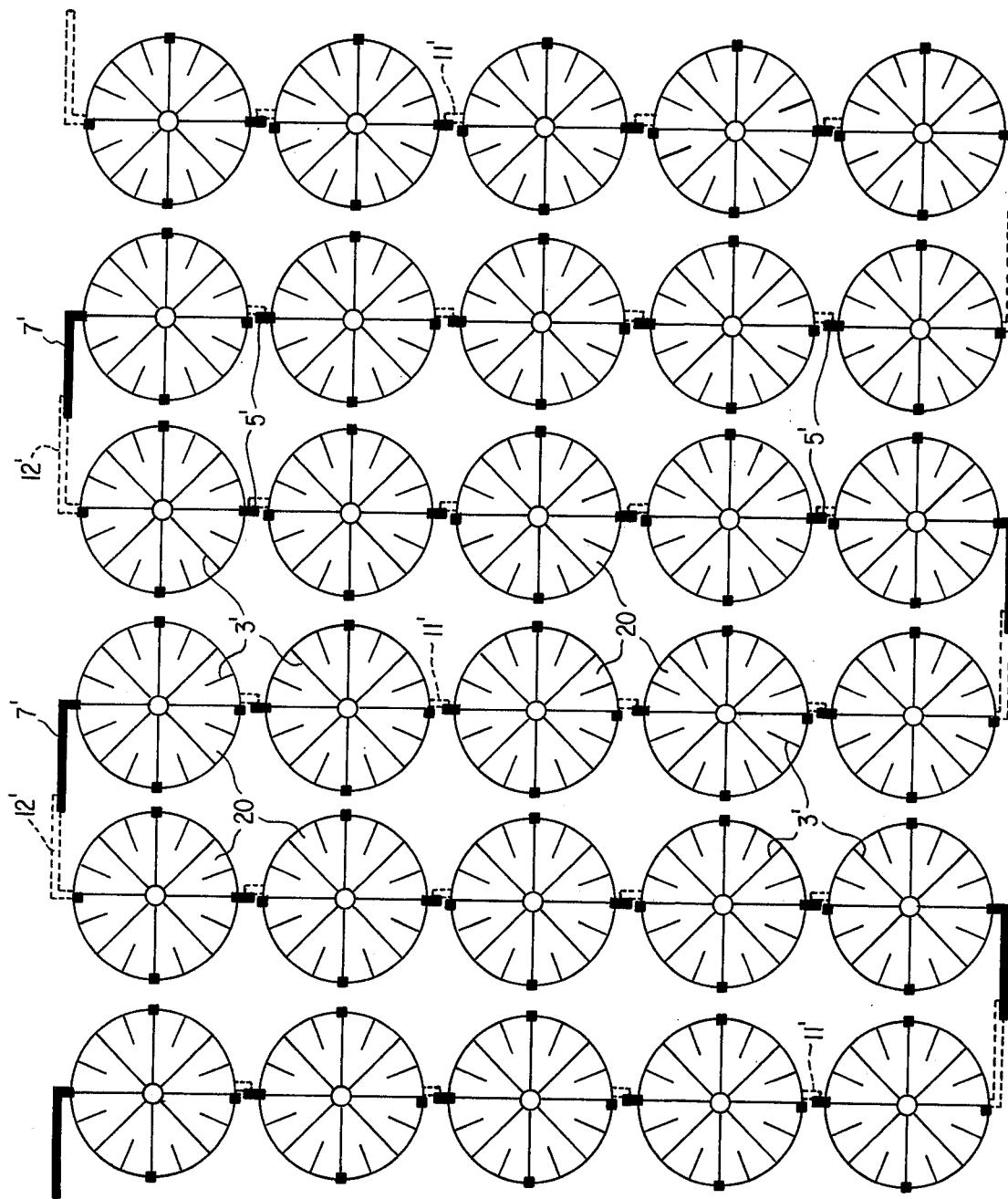
FIG. 5 is an example of a completed solar cell panel within the scope of the present invention.

The completed panels are then connected to bus bars either in series or in parallel for whatever electrical arrangement is desired as shown in FIG. 5 for example. FIG. 5 shows a completed panel wherein collector grid systems 3' of solar cells 20 are in continuous electrical connection via interconnections 5' and 11'. All of the rows of cells are connected in series by bus bar connectors 7' and 12', and are completely integrated in the circuitry of other panels by a main bus bar.

The types of solar cells which can be used in the method of the present invention are not critical, and any photovoltaic or thermoelectric cell can be used. Suitable solar cells include silicon polycrystalline wafers of any shape; circular, hexogonal, square, or rectangular shaped single crystal silicon wafers; thin film cadmium sulfide polycrystalline cells; polycrystalline cells, and single crystal wafers of gallium arsenide; thermoelectric thin film p-n junction semiconductor cells; thermoelectric metal - semi-conductor junction device; thermoelectric metal - metal couple devices and thermionic-diode devices.

The present method of fabricating solar cell panels can be completely automated. A significant advantage of the present solar panel system is the use of transparent conductive coatings in conjunction with metal and epoxy conductors to improve the current collection efficiency of the solar panels. Another advantage is that problems associated with the lifetimes of charge carriers at the collection surface can be avoided. That is, by using a transparent metal oxide conductive film over the entire surface of the solar cell wafer exposed to light energy, the photoenergized electrons are free to move directly to the collection grid system and do not have to move substantial distances through the bulk of the semiconductor to widely spaced grid bars unsupported by adjunct collecting layers. Consequently, solar cell silicon with shorter lifetimes may be effectively utilized and recombination losses minimized. By the present method, the surface and back collectors for each cell and interconnections can be formed separate from the cells themselves until the panel is ready to assemble. The conversion efficiency of the panels produced by the present method is at least as great if not greater than the conversion efficiency of any type of solar panel assembly now manufactured by hand. It is therefore believed that an entire solar energy system has been devised which is cost-competitive with conventional power-generating systems. Because the panels prepared by the present method have small surface area requirements, the panels may be used in the fabrication of electrical power sources for residential use either as a primary or adjunct energy system.

Having now fully described this invention, it will be apparent to one of ordinary skill in the art that many changes and modifications can be made thereto without departing from the spirit or scope of the invention as set forth herein.

What is claimed as new and desired to be secured by letters patent of the U.S. is:

1. A method of fabricating an integral solar cell panel containing a multiplicity of solar cells, which comprises:

forming an etched pattern of a multiplicity of solar cell collector grid systems with accompanying interconnection and bus bar tabs into a transparent, environmentally stable protective sheet;

depositing a layer of conductive metal into the etched regions of said protective sheet followed by a layer of a transparent conductive mixed metal oxide or metal oxide;

forming a pattern of conductive areas with accompanying interconnection and bus bar tabs corresponding to the collector grid systems and interconnection and bus bar tabs of said protective sheet on a substrate as a backelectrode for said solar cell panel; and bonding a multiplicity of solar cells between said protective sheet and said backelectrode substrate such that the position of said cells in the fabricated panel correspond to the positions of said collector grid systems on said protective sheet and the conductive areas on said backelectrode substrate.

2. The method of claim 1, wherein said solar cells of said panel are selected from the group consisting of silicon polycrystalline wafers; circular, rectangular, hexogonal and square shaped silicon single crystal wafers; thin film cadmium sulfide polycrystalline cells; gallium arsenide polycrystalline cells, gallium arsenide single crystal wafers; thermoelectric thin film p-n junction semiconductor cells, thermoelectric metal - semiconductor junction devices, thermoelectric metal-metal couple devices and thermionic diode devices.

3. The method of claim 1, wherein said protective sheet is a glass or plastic sheet.

4. The method of claim 1, which further comprises: forming said pattern in said protective sheet by applying a layer of photoresist to a sheet and covering said photoresist layer with a mask having said pattern of a multiplicity of solar cell collector grid systems with accompanying interconnection and bus bar tabs;
exposing said masked sheet to a source of activating radiation;
dissolving the unhardened areas of said photoresist layer under the opaque portions of said mask thereby forming the desired pattern in said photoresist layer; and
etching the exposed portions of said protective sheet, thereby forming an etched image of said pattern in said protective sheet.

5. The method of claim 4, wherein said etched portions are at least one millimeter in depth.

6. The method of claim 4, which further comprises:
depositing a layer of conductive metal in the etched regions of said protective sheet; and
depositing a layer of mixed metal oxide of metal oxide on the conductive metal in said etched regions of said protective sheet.

7. The method of claim 6, wherein said mixed metal oxide layer or said metal oxide is formed by depositing a layer of mixed metal or metal on said conductive metal in said etched regions of said protective sheet, and then oxidizing said mixed metal layer or metal layer by exposing said metal layer or mixed metal layer to an oxidizing atmosphere containing oxygen.

8. The method of claim 7, wherein said mixed metal or metal layer is a mixture of indium-tin, or indium-arsenic or tin.

9. The method of claim 6, wherein said mixed metal oxide layer is an indium oxide-arsenic oxide or indium oxide-tin mixture or tin oxide and is of a thickness of about 10 $\mu$m.

10. The method of claim 6, wherein said conductive metal is gold, copper, tin, titanium or silver of a thickness of about 250 $\mu$m.

11. The method of claim 1, which further comprises bonding said multiplicity of solar cells to said protective sheet and said backelectrode substrate by:
applying conductive metal filled epoxy adhesive to said collector grid system, interconnection and bus bar tabs on said protective sheet;
applying a conductive metal to said patterned area of said thermally shrinkable plastic or the surface of said cells which will be in contact with said thermally shrinkable plastic;
applying conductive metal filled epoxy between said solar cell wafers and said thermally shrinkable plastic;
applying heat and pressure to said cells positioned between said protective sheet and said backelectrode substrate to shrink said backelectrode substrate to provide secure conductive contact of said cells with said collector grid systems and said backelectrode, and to provide secure contact between the interconnection and bus bar tabs on said protective sheet and said backelectrode substrate.

12. The method of claim 11, wherein said thermally shrinkable plastic is a film of polyethylene, polypropylene, a polycarbonate or a polyester.

13. The method of claim 11, wherein said conductive metal epoxy is an epoxy resin containing silver, gold, nickel, copper or titanium particles of a size and quantity sufficient to possess a volume resistivity of $1 \times 10^{-4}$ to $1 \times 10^{-5}$ ohm-cm.

14. An integral solar cell panel prepared by the process of claim 1.

15. An integral solar cell panel containing a multiplicity of solar cells, which comprises:
a protective sheet having collector grid systems, interconnection and bus bar tabs etched into one surface thereof wherein the etched regions contain a first thin film of conductive metal and a superposed layer of transparent, conductive mixed metal oxide or metal oxide;
a backelectrode substrate having conductive areas corresponding to said collector grid systems and interconnection and bus bar tabs of said protective sheet; and
a multiplicity of solar cells sandwiched between and in conductive adhesive contact with said protective sheet and backelectrode substrate such that said cells are positioned between the mutually opposing collector grid system of said protective sheet and the conductive areas of said backelectrode substrate and such that mutually opposing interconnection and bus bar tabs on said protective sheet and backelectrode substrate are in firm contact in order to form a complete electrical network of said cells in said panel.

16. The solar cell panel of claim 15, wherein said protective sheet is a glass or plastic sheet.

17. The solar cell panel of claim 15, wherein said transparent mixed metal oxide or metal oxide layer is formed of an indium oxide-tin oxide mixture, an indium oxide-arsenic oxide mixture or tin oxide and is of a thickness of about 10 $\mu$m.

18. The solar cell panel of claim 15, wherein said conductive metal is gold, copper, tin, titanium or silver of a thickness of about 250 $\mu$m.

19. The solar cell panel of claim 15, wherein said adhesive contact is provided by a conductive metal filled epoxy adhesive having a volume resistivity of $1 \times 10^{-4}$ to $1 \times 10^{-5}$ ohm-cm.

20. The solar cell panel of claim 15, wherein said backelectrode substrate 15 a sheet of a thermally shrinkable plastic material of polypropylene, polyethylene, a polycarbonate or a polyester.

21. The solar cell panel of claim 15, wherein said solar cells of said panel are selected from the group consisting of silicon polycrystalline wafers, circular, rectangular, hexogonal and square shaped silicon single crystal wafers, thin film, cadmium sulfide polycrystalline cells, gallium arsenide polycrystalline cells, gallium arsenide single crystal wafers, thermoelectric thin film p-n junction semiconductor cells, thermoelectric metal - semiconductor junction devices, thermoelectric metal-metal coupled devices and thermionic diode devices.

* * * * *